United States Patent
Ogata et al.

(10) Patent No.: US 10,522,320 B2
(45) Date of Patent: Dec. 31, 2019

(54) CHARGED PARTICLE BEAM DEVICE AND METHOD FOR ADJUSTING CHARGED PARTICLE BEAM DEVICE

(71) Applicant: Hitachi High-Technologies Corporation, Minato-ku, Tokyo (JP)

(72) Inventors: Tomohiko Ogata, Tokyo (JP); Masaki Hasegawa, Tokyo (JP); Hisaya Murakoshi, Tokyo (JP); Katsunori Onuki, Tokyo (JP); Noriyuki Kaneoka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/088,880

(22) PCT Filed: Mar. 28, 2016

(86) PCT No.: PCT/JP2016/059793
§ 371 (c)(1),
(2) Date: Sep. 27, 2018

(87) PCT Pub. No.: WO2017/168482
PCT Pub. Date: Oct. 5, 2017

(65) Prior Publication Data
US 2019/0108969 A1 Apr. 11, 2019

(51) Int. Cl.
*H01J 37/147* (2006.01)
*H01J 37/29* (2006.01)
*H01J 37/05* (2006.01)
*H01J 37/04* (2006.01)
*H01J 37/22* (2006.01)

(52) U.S. Cl.
CPC ............ *H01J 37/147* (2013.01); *H01J 37/04* (2013.01); *H01J 37/05* (2013.01); *H01J 37/224* (2013.01); *H01J 37/226* (2013.01); *H01J 37/29* (2013.01)

(58) Field of Classification Search
CPC ...... H01J 37/147; H01J 37/226; H01J 37/224; H01J 37/29; H01J 37/04; H01J 37/05; H01J 37/1471; H01J 37/1472
See application file for complete search history.

(56) References Cited

U.S. PATENT DOCUMENTS 2,799,779 A * 7/1957 Weissenberg ......... H01J 37/224
850/43
6,465,781 B1 * 10/2002 Nishimura ............ H01J 37/026
250/305
(Continued)

FOREIGN PATENT DOCUMENTS

| JP | 2003-179113 A | 6/2003 |
| JP | 4131051 B2 | 8/2008 |
| JP | 4790324 B2 | 10/2011 |

OTHER PUBLICATIONS

International Search Report (PCT/ISA/210) issued in PCT Application No. PCT/JP2016/059793 dated Jun. 21, 2016 with English translation (two (2) pages).
(Continued)

*Primary Examiner* — Brooke Purinton
(74) *Attorney, Agent, or Firm* — Crowell & Moring LLP

(57) ABSTRACT

The objective of the present invention is to propose a charged particle beam device with which an imaging optical system and an irradiation optical system can be adjusted with high precision. In order to achieve this objective, provided is a charged particle beam device comprising: a first charged particle column which serves as an irradiation optical signal; a deflector that deflects charged particles which have passed through the inside of the first charged particle column toward an object; and a second charged particle column which serves as an imaging optical system. The charged particle beam device is provided with: a light source that emits light toward the object; and a control
(Continued)

device that obtains, on the basis of detection charged particles generated according to irradiation of light emitted from the light source, a plurality of deflection signals which maintain a certain deflection state, and that selects or calculates, from the plurality of deflection signals or from relationship information produced from the plurality of deflection signals, a deflection signal that satisfies a predetermined condition.

9 Claims, 7 Drawing Sheets

(56) References Cited

U.S. PATENT DOCUMENTS

| | | | |
|---|---|---|---|
| 6,765,217 B1* | 7/2004 | Nishimura | G01N 23/225 |
| | | | 250/491.1 |
| 7,547,884 B2 | 6/2009 | Hasegawa et al. | |
| 8,729,466 B1* | 5/2014 | Mankos | H01J 37/026 |
| | | | 250/305 |
| 8,779,360 B2* | 7/2014 | Miyake | H01J 37/28 |
| | | | 250/306 |
| 2003/0047682 A1 | 3/2003 | Hatakeyama et al. | |
| 2007/0085005 A1 | 4/2007 | Hasegawa et al. | |
| 2008/0315093 A1* | 12/2008 | Hasegawa | G01N 23/225 |
| | | | 250/310 |
| 2012/0235036 A1* | 9/2012 | Hatakeyama | G01N 23/2251 |
| | | | 250/310 |

OTHER PUBLICATIONS

Japanese-language Written Opinion (PCT/ISA/237) issued in PCT Application No. PCT/JP2016/059793 dated Jun. 21, 2016 (three (3) pages).

* cited by examiner

CHARGED PARTICLE BEAM DEVICE AND METHOD FOR ADJUSTING CHARGED PARTICLE BEAM DEVICE

TECHNICAL FIELD

The present invention relates to a charged particle beam device and a method for adjusting the charged particle beam device, and especially relates to a charged particle beam device and a method for adjusting the charged particle beam device appropriate for correcting a deviation of a beam trajectory with respect to an ideal optical axis to stably obtain a high resolution image.

BACKGROUND ART

A charged particle beam device is a device that irradiates a specimen with a charged particle beam such as an electron beam and an ion beam emitted from a charged particle source. Such a device includes a device including an irradiation optical system column (a lens-barrel) and an imaging optical system column. Patent Literature 1 discloses an electron microscope including two columns of an irradiation optical system and an imaging optical system. Further, Patent Literature 1 describes that a specimen is irradiated with ultraviolet rays to charge the specimen, and the specimen in a charged state is irradiated with an electron beam to detect defects. Patent Literature 2, similarly to Patent Literature 1, discloses an electron microscope including two optical systems. Further, Patent Literature 2 describes an evaluation method to evaluate an optical performance of an imaging optical system by arranging a Wien filter and an inspection chart and using electrons emitted from the inspection chart. The Wien filter separates an electron beam with which a specimen is irradiated off a trajectory of electrons emitted from the specimen. The inspection chart autonomously emits an electron beam for inspection. The inspection chart is arranged on a position of the specimen that is originally an irradiation object of the electron beam to perform an optical axis adjustment of the imaging optical system.

CITATION LIST

Patent Literature

Patent Literature 1: Japanese Patent No. 4790324 (corresponding to U.S. Pat. No. 7,547,884)
Patent Literature 2: Japanese Patent No. 4131051

SUMMARY OF INVENTION

Technical Problem

As disclosed in Patent Literature 2, separately from a beam source to irradiate the specimen with the electron beam, disposing a beam source to evaluate the imaging optical system ensures a selective evaluation of the imaging optical system and the like. As a result, a performance evaluation of the imaging optical system is ensured without a beam irradiation by the irradiation optical system. However, it is necessary to install an emitter that emits the electron on a position on which the specimen is arranged. That is, it is necessary to dispose, for example, an exchange mechanism that exchanges the emitter for the specimen. In order to perform an appropriate performance evaluation, it is necessary to accurately position the emitter on an ideal optical axis of the imaging optical system. However, the higher magnification a device obtains an image at, the more difficult it is to perform accurate positioning. In Patent Literature 1, there is no discussion about an evaluation method to selectively evaluate the imaging optical system and the like.

The following proposes a charged particle beam device and a method for adjusting the charged particle beam device having an object to ensure an adjustment of an imaging optical system and an irradiation optical system with high precision, without, for example, an insertion of an emitter and the like into a specimen position and accurate positioning.

Solution to Problem

As one aspect to achieve the above-described object, a charged particle beam device is proposed. The charged particle beam device includes a first charged particle column that surrounds a passing trajectory of charged particles emitted from a charged particle source, a deflector that deflects the charged particles that have passed through inside the first charged particle column toward an object, a second charged particle column through which irradiation of the charged particles toward the object obtains charged particles that pass, a light source in which a light is irradiated toward the object, and a control device that obtains a plurality of deflection signals to maintain a certain deflection state based on a detection of charged particles generated corresponding to the irradiation of the light emitted from the light source, and selects or calculates a deflection signal where information obtained by the irradiation of the charged particles from the charged particle source fulfills a predetermined condition from the plurality of deflection signals or from relationship information created from the plurality of deflection signals.

A method to perform the adjustment as described above is also proposed.

Advantageous Effects of Invention

The above-described configuration ensures the adjustment of the imaging optical system and the irradiation optical system with high precision.

DESCRIPTION OF EMBODIMENTS

Figure 1:
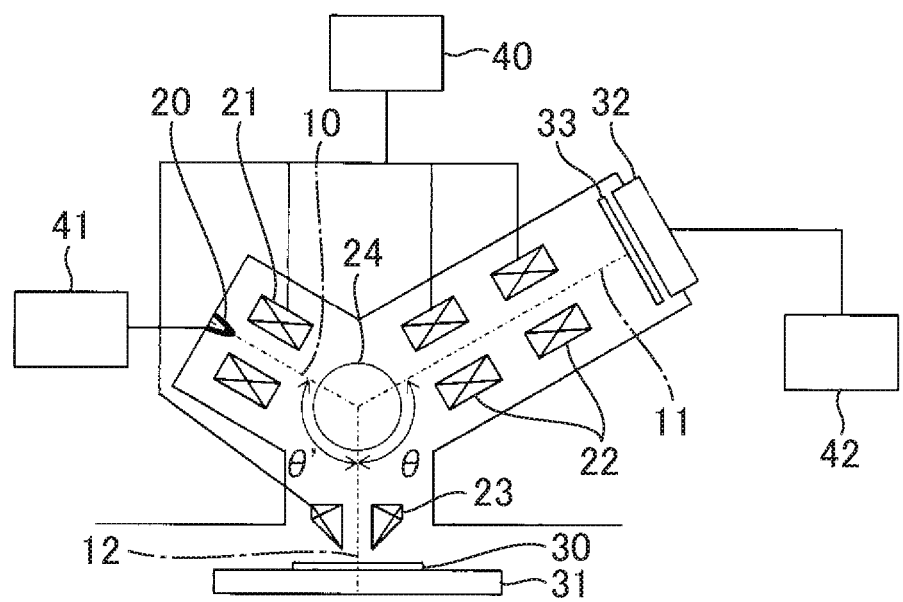
FIG. 1 is a view illustrating an exemplary charged particle beam device including two optical systems (columns).

A semiconductor device manufacturing process includes a process to form a fine circuit on a wafer made of, for example, Si and SiC polished into a mirrored surface shape. When there is a foreign matter, a scratch, a crystal defect, or the like on such a wafer, a defect or a material deterioration possibly occurs in a formation process of a circuit pattern to prevent a manufactured device from normally operating, prevent a desired electric property from being obtained, or cause a reliability degradation of the operation.

A device that inspects the wafer includes a device (an optical scattering inspection device) that inspects a surface condition of the wafer by irradiating a wafer surface with a light having a certain wavelength from visible to ultraviolet (hereinafter simply referred to as a light) to sense a light scattered on the surface, and an inspection device to which an optical microscope technique such as a differential interference is applied. However, as a finer semiconductor device is developed, it becomes necessary to control a foreign matter that is fine to the extent that a scattering intensity sufficient for detection cannot be obtained. In an optical microscope, it has been proved that a crystal defect whose image cannot be made affects reliability characteristics of the semiconductor device. Thus, an advanced quality management is possibly not expected in an optical inspection device.

Meanwhile, a device to detect the foreign material and the defect that are difficult for the optical inspection device to detect includes an electron microscope. The electron microscope has an extremely high spatial resolution. Thus, the electron microscope can obtain an image of a foreign matter having a size equal to or smaller than 20 nanometers where the scattering intensity of the light is significantly low. Since the electron beam is made of charged particles, the electron microscope can detect the defect that the light cannot detect, using electric characteristics of the crystal defect. However, the electron microscope can obtain the image in a practical period for an observation in a small visual field with a micron size, but needs an enormous volume of observation period for a thorough observation to inspect a whole surface of the wafer as a semiconductor substrate. For example, in a case that a whole Si wafer surface having a diameter with 100 millimeters is inspected with a resolution with about 10 nanometers, when a trial calculation is done in a typical condition, a period of about six days is necessary in a scanning electron microscope.

Therefore, in order to ensure an increase in an inspection speed, the embodiment proposes a use of a map-type electron microscope. More specifically, a description will be given for exemplifying an electron beam device that detects a signal obtained by irradiating a specimen with an electron beam (a charged particle beam). The electron beam device obtains an electron image for inspection by providing a negative electric potential equal to or slightly larger than an accelerating voltage of the irradiation electron beam to the wafer surface, inverting the electron beam with which a whole inspection visual field on the wafer surface is irradiated in approximately parallel at an angle perpendicular to the wafer surface at an angle of approximately 180 degrees with respect to an entering direction of the beam immediately above the wafer surface, thus forming an image of the inverted electron in an electron lens. This inverted electron is hereinafter referred to as a mirror electron.

The following describes a configuration of a mirror electron microscope that generates an image based on a detection of the mirror electron with reference to FIG. 1. A specimen is arranged such that a specimen surface direction is perpendicular to an objective-lens optical axis 12 (an ideal optical axis of the beam). Electrons emitted from an electron gun 20 are accelerated by, for example, an acceleration electrode (not illustrated) to become electron beams (electron beams). The electron beams are converged by an irradiation lens 21, and then, pass through an optical axis 10. The electron beams converged by the irradiation lens 21 are deflected to travel along a trajectory of the objective-lens optical axis 12 by a beam separator 24. The irradiation electron beams are converged on a back focal plane of an objective lens 23. Then, a specimen 30 is irradiated with the irradiation electron beams. The electron beams deflected by the beam separator 24 have open angles. The electron beams become collimated beams such that the open angles are adjusted by the objective lens 23. Thus, the specimen 30 is perpendicularly irradiated with the collimated beams along the objective-lens optical axis 12. A negative voltage is applied to the specimen 30 or a stage 31 from a negative voltage application power supply (not illustrated). As the negative voltage applied from the negative voltage application power supply, a voltage approximately equal to or slightly higher than an accelerating voltage applied to between a chip of the electron gun 20 and the acceleration electrode is applied. Thus, the electron beams are reflected toward an image pickup device without reaching the specimen 30. Since the irradiation electron beams do not reach the specimen, an image reflecting an electric potential distribution (an equipotential surface) on the specimen, not a specimen surface shape, can be obtained. After the inverted electron beams pass through the objective-lens optical axis, these inverted electron beams pass through the beam separator 24 adjusted to follow an electron beam trajectory identical to a trajectory of an optical axis 11 of an imaging lens. The electron beams that have passed through the beam separator pass a center of an imaging lens 22 to form an image in a scintillator 33. A camera 32 is a two-dimensional image pickup device to take an image of a scintillator that has emitted light by an incidence of the electron beams. The camera 32 can obtain a signal to make an image of the electric potential distribution on the specimen.

In the mirror electron microscope, while a light source (an electron source) position of an irradiation optical system is different from an imaging position of an imaging optical system, an optical axis of the irradiation optical system matches an optical axis of the imaging optical system on the specimen 30. Thus, it is necessary to deflect any of or both of the irradiation optical system and the imaging optical system to separate off them, using, for example, the beam separator 24.

In an electron microscope device to immediately form an image of the electron beams with which the specimen is irradiated, when the irradiating-system optical axis 10 and the imaging-system optical axis 11 are not adjusted, a deterioration of the obtained image occurs. In a transmission electron microscope, since the irradiating system, the specimen, and the imaging system lie on a straight line, the adjustment is relatively easy. However, in an electron optical system of the mirror electron microscope, when an adjustment of the beam separator 24 is not accurately performed with respect to the irradiating-system optical axis 10 and the optical axis 11 of the imaging lens, the inverted beams do not reach the scintillator 33. Thus, the image cannot be observed by the camera 32. Accordingly, it is necessary to perform the adjustment in a blind way.

Furthermore, when the irradiation electron beams do not perpendicularly enter the specimen, a trajectory of the irradiation electron does not match a trajectory of the inverted electron beams between the specimen and the objective lens. Thus, a large aberration occurs in the objective lens. When the optical axis of the irradiation electron does not pass the objective-lens optical axis 12, a collimated irradiation cannot be uniformly performed on the specimen, thus generating a variation in height to invert within a specimen surface. When the optical axis of the inverted electron beam does not pass the objective-lens optical axis, an off-axis aberration such as a coma aberration and astigmatism occurs to significantly deteriorate the obtained image.

In an embodiment described below, a description will be given of a charged particle beam device where the irradiation optical system and the imaging optical system are configured by different columns (mirror bodies). The charged particle beam device selectively performs a beam irradiation on the imaging optical system when adjusting the imaging optical system and the beam separator and ensures the selective beam irradiation on the imaging optical system without installing a charged particle source on a specimen position when performing the selective beam irradiation on the imaging optical system.

In order to install an electron source specialized for causing the beam to selectively pass through the imaging optical system on a specimen position, it is necessary to mount a mechanism used only at the time of adjustment on a substrate, and eventually a stage side. In the electron microscope, the objective lens is often moved close to the specimen for improving a resolution. Thus, it is difficult to make a thick structure.

Therefore, the embodiment proposes a charged particle beam device that ensures the beam irradiation from the specimen position toward the imaging optical system without positioning, for example, the electron source on the specimen position and without the beam irradiation from the irradiation optical system.

In the embodiment described below, a description will be given of a method for adjusting an electron microscope and the electron microscope. The electron microscope has an irradiating-system optical axis and an imaging-system optical axis and includes a beam separator that separates the electron beams passing the two axes. The method for adjusting the electron microscope includes a process to place a specimen on the optical axis and use a photoelectron generated by irradiating this specimen with the light so as to calculate a condition of the beam separator for adjusting the axis and causing the electron beam to pass through from the specimen to the imaging position, and a process to adjust the condition of the beam separator for causing the electron beam to pass through from an electron-beam generation position to the specimen or the imaging position on the optical axis.

More specifically, the embodiment proposes a method to facilitate an optical-axis adjustment without changing a mechanism on a side holding the specimen at the time of an actual observation and by previously obtaining an imaging-system-optical-axis entering condition of an optical axis of the imaging lens system and the beam separator 24, by mounting an ultraviolet-ray optical system on the electron microscope to use the photoelectron generated when the specimen is irradiated with ultraviolet rays for the optical-axis adjustment of an imaging lens system.

Figure 2:
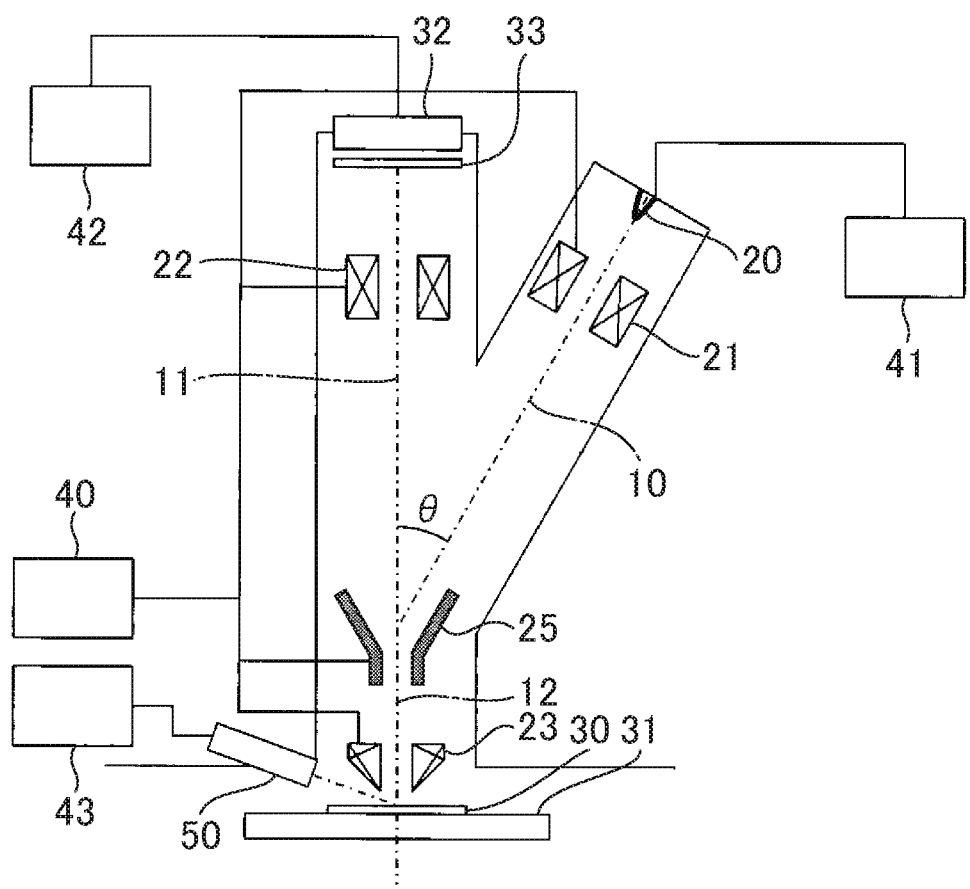
FIG. 2 is a view illustrating an exemplary charged particle beam device including two optical systems.

The following describes embodiments with reference to the drawings. However, in the following description, identical reference numerals designate identical components, and the following sometimes omits the repeated description. FIG. 2 is a view illustrating an exemplary mirror electron microscope. In the mirror electron microscope, the electron beams emitted from an electron gun 20 are converged by an irradiation lens 21, and introduced in a direction of an objective-lens optical axis 12 perpendicular to a specimen through a beam separator 24, thus being changed to a parallel illumination by an objective lens 23. A voltage equal to or slightly higher than an electron-gun accelerating voltage is applied to a specimen 30 through a stage 31. The electron beams are inverted immediately above the specimen 30. The inverted electron beams are introduced into the imaging-system optical axis by the beam separator 24 and projected in an imaging lens 22, thus forming an enlarged image on a scintillator 33. The scintillator 33 converts an electron beam image into an optical image, and a camera 32 obtains the optical image.

It is necessary for a device as exemplified in FIG. 2 to be adjusted to cause electrons emitted from the electron beam or the specimen to accurately pass through the ideal optical axis. It is necessary for the beam separator 24 to have been adjusted to deflect the electron beam emitted along an irradiating-system optical axis 10 by an angle θ (an angle between the irradiating-system optical axis 10 and the objective-lens optical axis 12). For the electron reflected in a retarding field formed immediately above the specimen 30 to fly to the beam separator 24 from a direction of the specimen 30, it is necessary that an electric field and a magnetic field in a crossed electromagnetic field have been adjusted to cause the electron to head for the scintillator 33 along an imaging optical axis 11. In a case of the optical system as in FIG. 1, it is necessary to perform a parameter adjustment so that the electron bends by an angle θ' between the objective-lens optical axis 12 and the imaging-system optical axis 11.

For the imaging lens 22, it is necessary to adjust a lens parameter such that the electron beams projected in the objective lens focus into the enlarged image on the scintillator 33. In order to show the image, the adjustment of the beam separator 24 is especially important. When the parameter is not adjusted to simultaneously fulfill a condition to bend the electron beam from above that passes the irradiating-system optical axis 10 by θ and a condition to cause the electron reflected by the retarding field to travel in a straight line (a condition to bend the electron by θ' in the optical system in FIG. 1), the electron does not properly reach the scintillator 33 to make it difficult to obtain the image using the camera 32.

First Embodiment

In this embodiment, a description will be mainly given of an electron microscope including a light source that generates a beam to evaluate a device condition of the imaging optical system. The electron microscope exemplified in FIG. 2 includes an ultraviolet-ray light source 50 and an ultraviolet-ray-light-source control device 43. The ultraviolet-ray light source 50 is installed such that an electron-beam irradiation position (an ideal reaching position (immediately below the ideal optical axis of the electron beam) of the electron beam emitted from the electron gun 20) of the specimen 30 is irradiated with the ultraviolet rays. The ultraviolet-ray light source 50 may be narrowed down to a magnitude similar to that of a visual field on the specimen observed with the electron beam, or may have a magnitude equal to or more than that of this visual field. In a case of an electron microscope including an antistatic ultraviolet-ray light source, this ultraviolet-ray light source may be shared. As the beam separator, a Wien filter is used. The ultraviolet-ray light source 50 in this embodiment is one for charging the reaching position of the electron beam. Since the ultraviolet-ray light source 50 is installed so that an appropriate position is irradiated with the ultraviolet rays, as described later, the ultraviolet-ray light source 50 can take a specimen surface as the electron source without, for example, positioning, and can irradiate the imaging optical system with the electron beam from an accurate position. The electron generated from the specimen by the ultraviolet irradiation is accelerated toward the imaging optical system by an electric field (a retarding field for the entering electron beam) formed between the objective lens 23 (for example, a ground potential) and the specimen to which the negative voltage is applied. Thus, the ultraviolet-ray light source 50 and the specimen 30 become electron sources exclusive for the imaging optical system.

Figure 3:
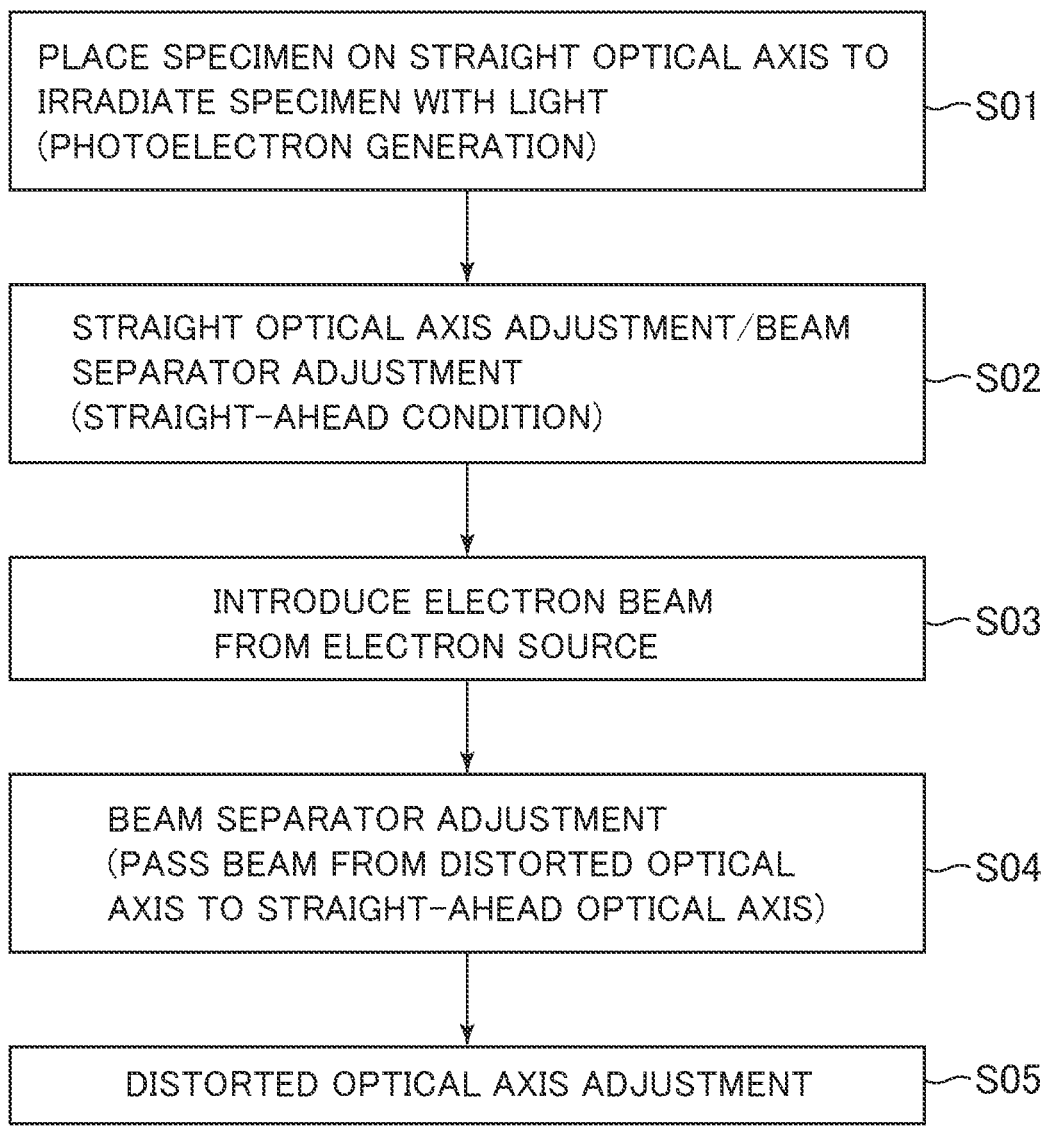
FIG. 3 is a flowchart illustrating a process to adjust a deflection condition of a beam separator.

A description will be given of an optical axis adjustment process of the electron microscope as exemplified in FIG. 2 with reference to FIG. 3. By employing a processing algorithm as exemplified in FIG. 3, it is possible to first adjust an imaging-system-optical-axis entering condition of a Wien filter 25 not adjusting the Wien filter 25 to simultaneously fulfill two conditions. The processing algorithm as exemplified in FIG. 3 or processing algorithms as exemplified in FIGS. 7 and 8 described below are preliminarily stored in a predetermined storage medium as programs. An integrated control device (not illustrated) automatically controls respective components of the electron microscope in accordance with these programs.

First, the specimen 30 is placed on the stage 31. For the specimen, it is preferable to use one from which the photoelectron is easily generated with the ultraviolet rays emitted from the ultraviolet-ray light source 50. Alternatively, an ultraviolet-ray light source 50 that generates ultraviolet rays having an energy equal to or more than a work function of the specimen 30 is used. It is also preferable to introduce a specimen on which a pattern is formed to ensure an axis adjustment using image processing. When an axial deviation is evaluated, based on an evaluation of a deviation (a parallax) of the image, a degree of the axial deviation is determined. In order to evaluate a two-dimensional deviation of the image, it is preferable to use a pattern (for example, a cross pattern) expanding in a two-dimensional direction that ensures an evaluation of a deviation in an X-Y direction. The pattern is not necessary to be accurately positioned on a visual field center. Insofar as the pattern is positioned anywhere in the visual field, a parallax evaluation can be performed based on the obtaining of the image. Thus, the parallax evaluation can be performed without advanced positioning such that an emitter is matched with the imaging optical system.

After the specimen has been introduced, the specimen 30 is irradiated with the ultraviolet rays from the ultraviolet-ray light source 50 (Step 1 in the flowchart). In this respect, an ultraviolet irradiation region may be adjusted to become identical with the visual field observed with the electron beam using, for example, an optical lens. However, when the ultraviolet irradiation region is larger than the visual field observed with the electron beam, a photoelectron image can be obtained. Next, the parameter adjustment is performed for a deflection condition of the imaging-lens optical axis 11 and the Wien filter 25 (Step 2 in the flowchart).

In Step 2, parameters of the imaging lens 22 and the Wien filter 25 are adjusted. For the adjustment of the Wien filter 25, for example, when there are a plurality of adjustment parameters, an adjustment method as described as a constraint function between the plurality of parameters can be taken. This constraint function reduces a count of the parameters to easily ensure the later adjustment of the optical axis 10 of the irradiation lens. When the constraint function is generated, wobbling to change an intensity of the objective lens 23 with a constant amplitude may be performed to strictly perform the adjustment not to move a center of the image, thus confirming a range of a value of a combination of E and B in detail. This fine adjustment of the parameter can generate a more strict constraint function. Enhancing the resolution of the image by performing the wobbling of the objective lens only on the imaging system also leads to a high precision of the later axis adjustment. When the deviation (the parallax) of the image is generated by the wobbling of the objective lens, the optical axis adjustment is performed by an alignment deflector (not illustrated) so that this parallax becomes zero, or equal to or less than a predetermined value.

Figure 7:
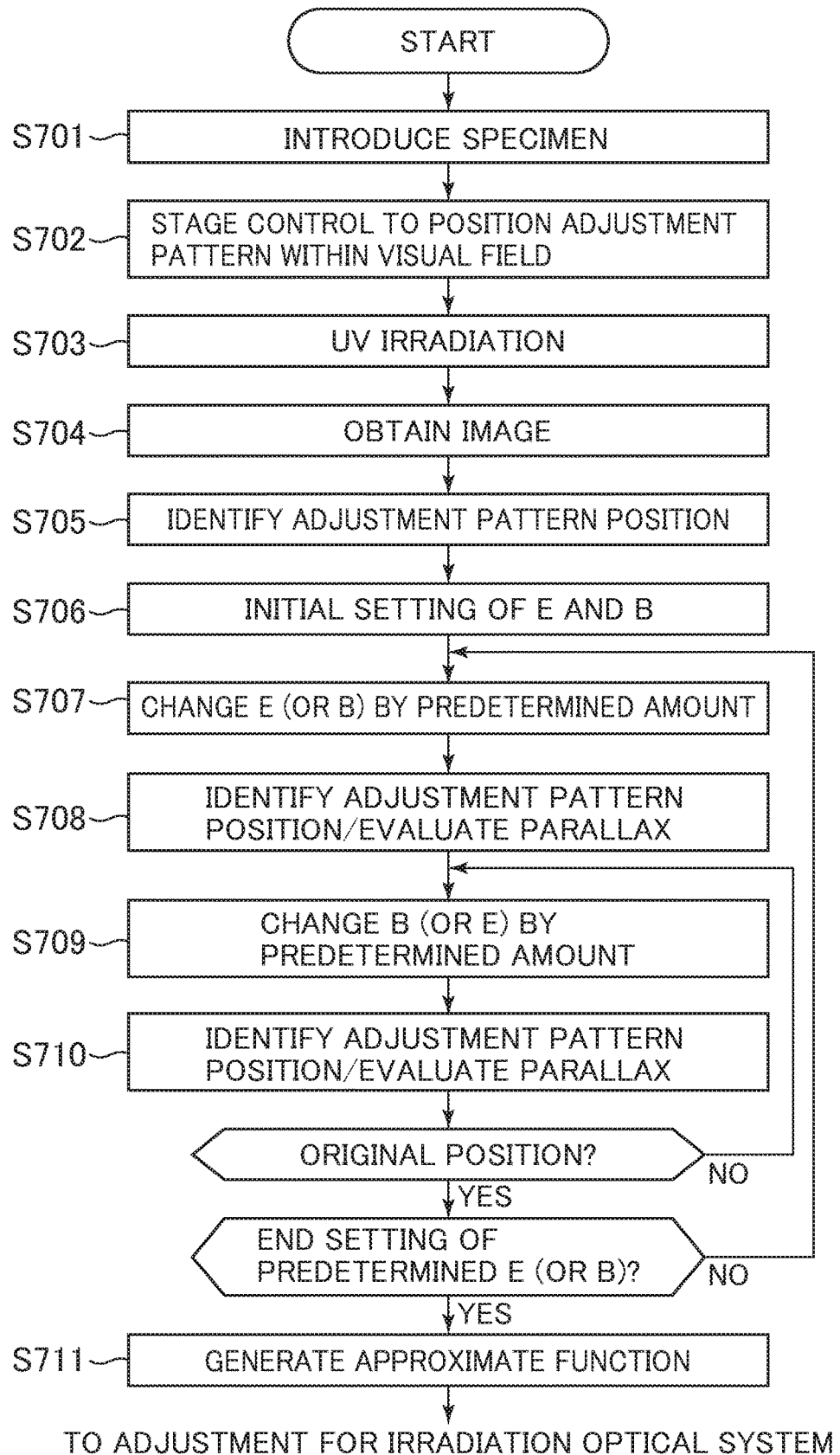
FIG. 7 is a flowchart illustrating a device condition adjustment process of the imaging optical system based on an ultraviolet irradiation.

FIG. 7 is a flowchart illustrating an exemplary process to generate an approximate function needed for the axis adjustment of the imaging optical system (FIG. 7 exemplifies an adjustment of a separator 25 (the Wien filter)) and the adjustment of the irradiation optical system, using the photoelectron emitted by the ultraviolet irradiation with respect to the specimen. First, the specimen is introduced into a vacuum specimen chamber (Step 701). A pattern that allows image recognition is provided on this specimen. As described later, this pattern is used for monitoring the deviation (the parallax) of the image when the device condition is changed. Thus, it is preferable to employ a pattern easy to specify a two-dimensional deviation ($\Delta x$, $\Delta y$) as the cross pattern. In order to allow the image recognition in a mirror state, it is preferable to be formed such that a charge state in a pattern portion is different from a charge state in the rest. For example, it is considered that the pattern portion is made of an insulating member, and the rest is made of a conductive member. Next, the stage 31 is controlled so as to position the above-described pattern (an adjustment pattern) on the visual field (an irradiation region of the electron beam) (Step 702). In this respect, the pattern is not necessarily required to be in the center of the image. Insofar as the pattern is included within the visual field, it is possible to obtain ($\Delta x$, $\Delta y$). Thus, the axis adjustment with high precision can be performed without the positioning with high precision.

Next, an image obtained by irradiating the adjustment pattern with the ultraviolet rays is obtained (Steps 703 and 704). The photoelectron is emitted from the specimen by irradiating the specimen with the ultraviolet rays. The photoelectron is accelerated toward the imaging optical system by the retarding field formed on the specimen to reach the scintillator 33 through the separator 25 and the imaging lens 22. An image of an emission of light by the scintillator 33 resulting from reaching of the electron to the scintillator 33 is taken by the camera 32 to generate an image of a region including the adjustment pattern. Next, a position ($x_0$, $y_0$) of the adjustment pattern on the formed image is recognized with the image processing (Step 705).

After the recognition of an initial pattern position, an electric field (E) formed between electrodes included in the separator 25 and a magnetic field (B) adjusted by a current supplied to a coil are set (Step 706). In this state, it is assumed that a Wien condition (a state where a deflection action by E is canceled by B) is kept. In a case where the parallax occurs when the separator 25 is operated, a correction is performed to eliminate the deviation of the image by the adjustment of E or B.

Next, one of E and B is changed by a predetermined amount (Step 707), and a position ($x_1, y_1$) of the adjustment pattern at this time is identified to calculate a parallax ($x_1-x_0, y_1-y_0$) when the condition of the separator 25 is changed (Step 708, and in the following description, a description will be given taking a case where E is changed in Step 708 as an example). Next, in order to search B where the parallax ($x_1-x_0, y_1-y_0$) generated when E is changed from $E_0$ to $E_1$ in Step 707 is zero, or equal to or less than the predetermined value, a parallax when B is gradually changed is evaluated (Steps 709 and 710). A state where the parallax is zero is a state where a deflection action by the electric field of the electron emitted from the specimen is canceled by a deflection action of the magnetic field. Steps 709 and 710 are repeated until this state where (a certain deflection state) is found.

Figure 5:
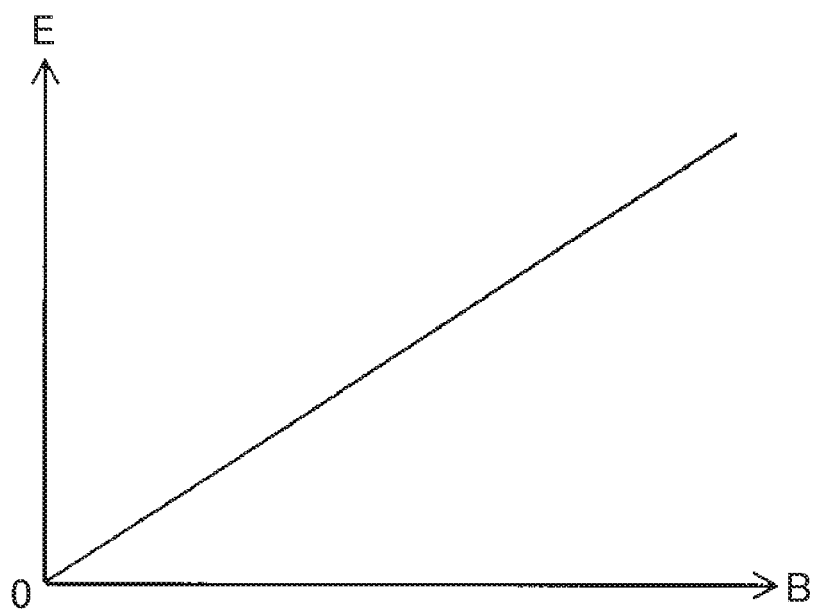
FIG. 5 is a view illustrating an exemplary function that indicates a relationship between a voltage applied to the Wien filter and a current to be supplied, and fulfills a predetermined condition (a condition that a beam travels in a straight line along an optical axis of an imaging optical system).

For one E (a voltage value applied to the electrode), after an appropriate B (a current value supplied to the coil) has been found, Step 707 to Step 710 are repeated until B with respect to a predetermined count of Es are found, in order to search B that satisfies the Wien condition for other Es. After the predetermined count of combinations of E and B have been found, an approximate function indicating a change of B with respect to a change of E as exemplified in FIG. 5 is obtained with, for example, fitting (Step 711). Changing E and B according to the approximate function generated as described above can change conditions of E and B while maintaining an appropriate adjustment state with respect to the imaging optical system. In the adjustment of the irradiation optical system described later, changing E and B according to the above-described approximate function performs an appropriate adjustment of the irradiation optical system without changing the adjustment state of the imaging optical system. In this embodiment, an example to generate the function taking E and B as variables is described. However, it is not limited to this. For example, a function taking another variation factor as a variable may be generated. Further, without generating the function, a plurality of combinations of E and B that fulfill the above-described condition may be obtained and stored.

After the adjustment of the imaging optical system has been terminated with the photoelectron image, the ultraviolet irradiation from the ultraviolet-ray light source 50 is stopped to emit the electron beam from the electron gun 20 (Step 3 in the flowchart). Then, the Wien filter 25 is adjusted to see the image while reducing a count of the parameters using, for example, the constraint function so that the irradiation electron beam proceeds to the objective-lens optical axis. Then, the irradiation electron beam is adjusted so that the specimen 30 is irradiated with the electron beams in parallel in the irradiation lens 21 (Step 4 in the flowchart). In this respect, the adjustment of the irradiating system may be performed by comparing the photoelectron image obtained in Step 2 in the flowchart with the image obtained by emitting the electron beam.

Figure 8:
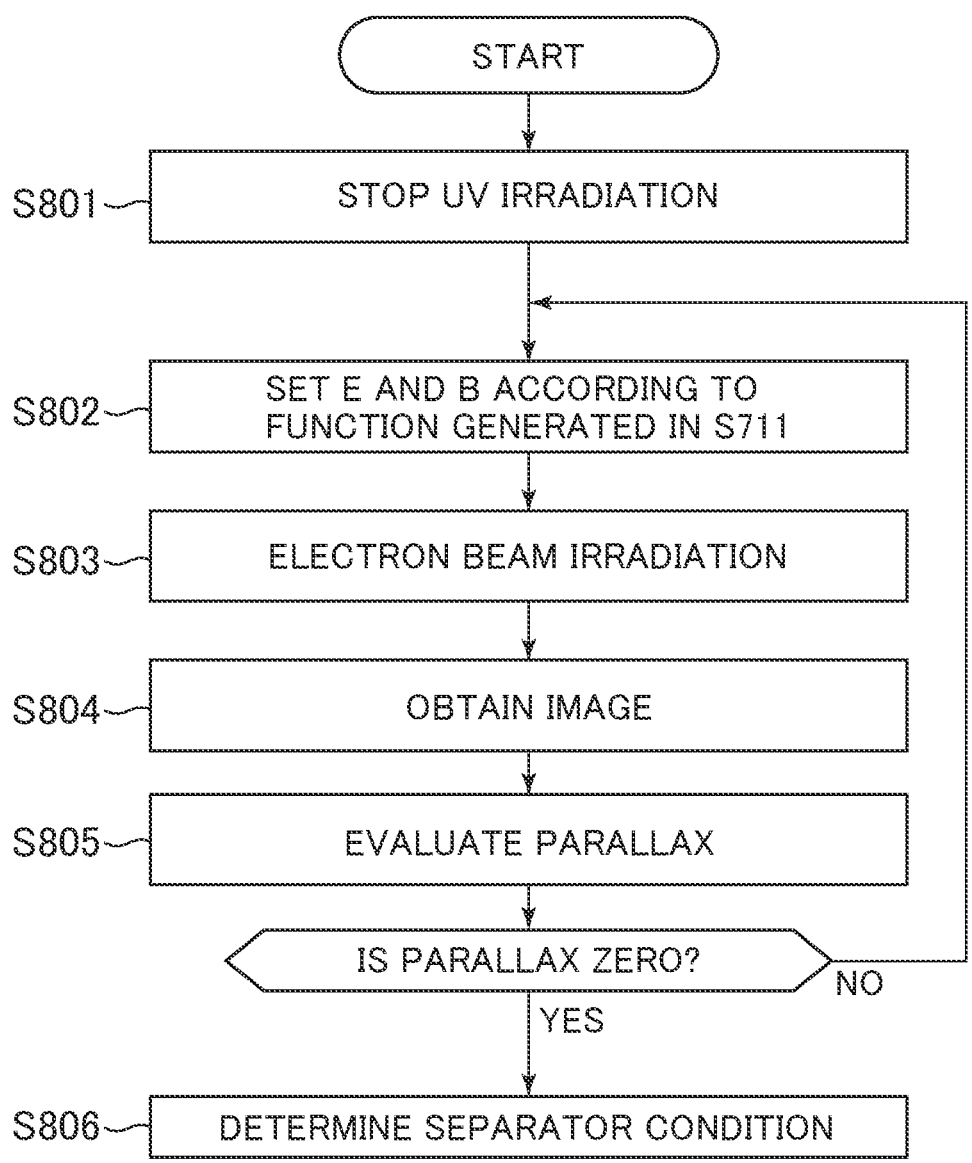
FIG. 8 is a flowchart illustrating a device condition adjustment process of an irradiation optical system based on a charged particle beam irradiation.

FIG. 8 is a flowchart illustrating a process to adjust the irradiation optical system (this example exemplifies the adjustment of the separator 25) after the adjustment of the imaging optical system has been terminated. First, the irradiation with the ultraviolet rays emitted at the time of the adjustment of the imaging optical system is stopped (Step 801). Next, E and B are set according to the function generated in Step 711 (Step 802). When the function has not been generated, E and B for an initial setting are readout from the registered plurality of combinations of E and B. In a state where E and B have been set, the electron beam is emitted from the electron gun 20. Based on a detection signal obtained based on this irradiation, an image is generated (Step 804). In this image, a position of the adjustment pattern is specified to evaluate a parallax with an original position (for example, the position of the adjustment pattern specified in Step 705) (Step 805). Repeating the processes in Steps 802 to 805 so that this parallax becomes zero, or equal to or less than the predetermined value can find an appropriate separator condition. The photoelectron image and an electron microscope image are different in vision. Thus, when it is difficult to specify an accurate position in a deviation detection method such as a pattern matching process that evaluates a correlation of general two images, for example, a barycentric position of the pattern may be detected to evaluate its deviation. Various kinds of means are considered for detecting a barycenter. For example, it is considered to extract an outline of the pattern and obtain its range image to detect the barycentric position.

When the function has not been generated, the appropriate separator condition is read out with reference to, for example, a table where the plurality of combinations of E and B are stored (relationship information between E and B other than the function).

As in this embodiment, adjusting the irradiation optical system without moving the specimen position (the position of the adjustment pattern) after the adjustment of the imaging optical system is performed ensures the adjustment with high precision without a pattern position variation as a criterion for parallax determination.

Figure 9:
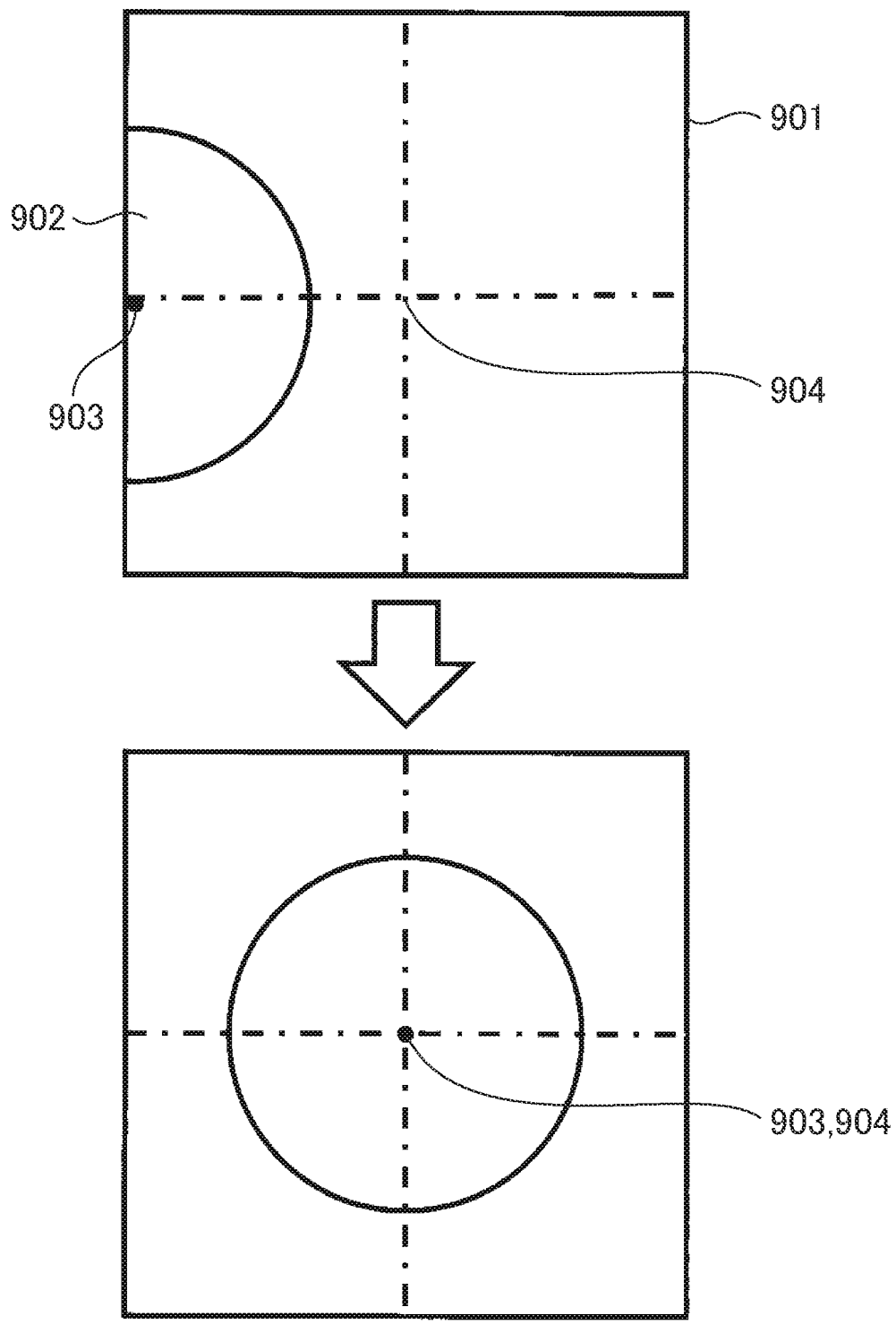
FIG. 9 is a view illustrating an exemplary image shown when a device condition is adjusted, based on an adjustment of a positional relationship between a visual field of an image pickup device and a projected image of charged particles.

The flowchart in FIG. 8 describes the process to find the appropriate separator condition based on the parallax evaluation of the adjustment pattern. However, the separator condition may be adjusted using an image showing a reaching position of the electron of the scintillator 33. FIG. 9 is a view illustrating a state where an electron projected image 902 (a brightness region) is shown within a visual field 901 of the camera 32. When the adjustment using the projected image 902 is performed, in Step 805 in FIG. 8, a deviation between a center 903 of the projected image 902 and a center 904 of the visual field 901 is evaluated to search a combination of E and B where E matches B (a state in a lower view in FIG. 9), or where the deviation is equal to or less than the predetermined value through the process as exemplified in FIG. 8 (to select or calculate a deflection condition that fulfills a predetermined deflection condition). Even when a separator adjustment is performed by evaluating a deviation between a center of the brightness region and the visual field center, finding the combination of both according to the function generated in Step 711 can adjust the irradiation optical system while maintaining an appropriate condition for the imaging optical system.

When the imaging optical system is adjusted, the deviation between the visual field center and the center of the brightness region may be evaluated as described above to generate the function based on this deviation evaluation. The ultraviolet irradiation region is larger than the irradiated region of the electron beam. Thus, it is good to project the ultraviolet rays to the scintillator by narrowing down the region of the photoelectron using a lens of the imaging-system to find a deflector condition (a combination condition of the electric field and the magnetic field) where (a center of) this projecting position is positioned on a predetermined position (for example, the visual field center).

As described above, the irradiation optical system can be adjusted while maintaining the appropriate condition for the imaging optical system by selecting the deflection signal where the information (for example, parallax information, barycenter deviation information, and information on a deviation between the projected image and the visual field center) obtained by emitting the charged particle from a charged particle source fulfills a predetermined condition (the deviation is zero, or equal to or less than the predetermined value) at the time of the adjustment of the irradiation optical system.

Figure 4A:
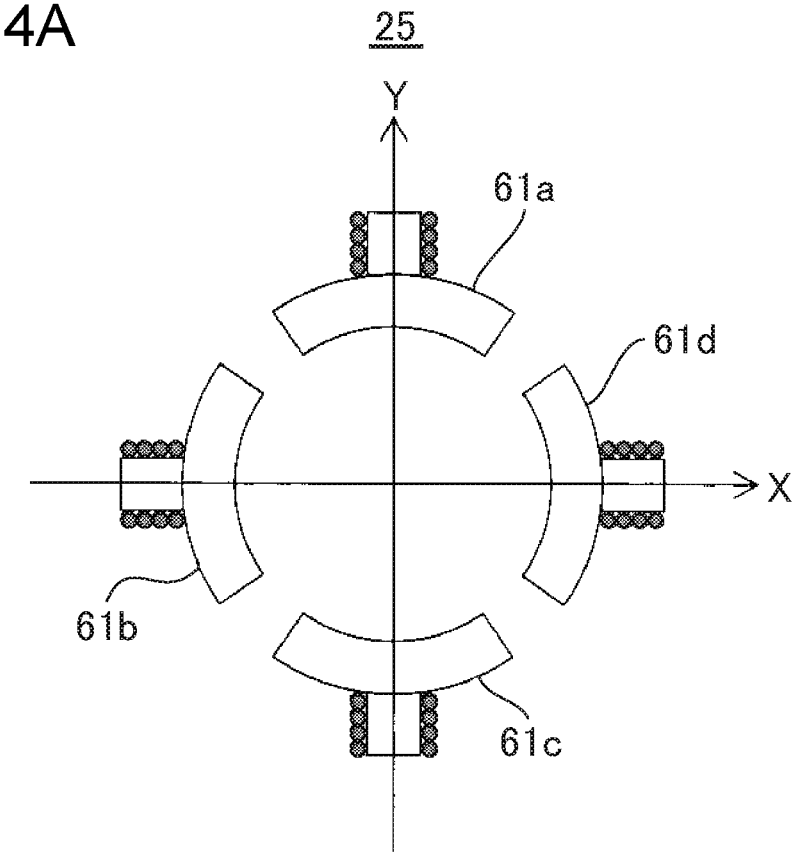
FIGS. 4A and 4B include views illustrating a structure of a Wien filter.
Figure 4B:
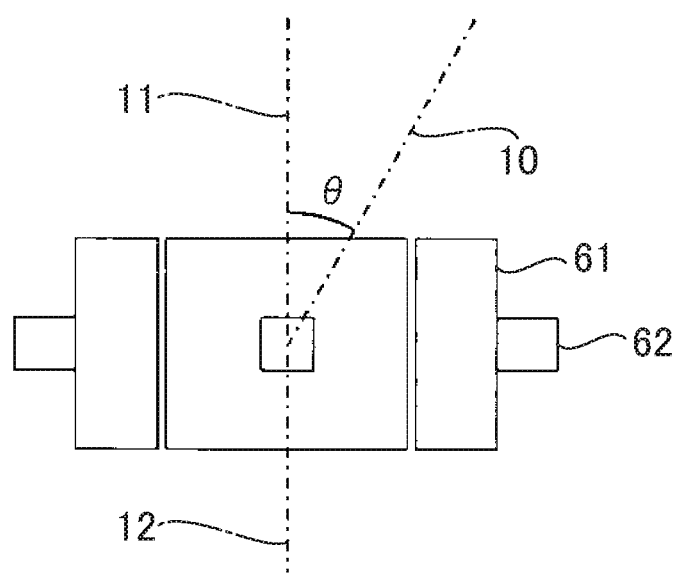

FIG. 4 includes views illustrating a specific configuration of the Wien filter 25 used as the beam separator. FIG. 4 exemplifies a Wien filter including four electromagnetic poles. Each electromagnetic pole includes an electrode 61 and a coil 62. This embodiment describes the Wien filter including the four electromagnetic poles. However, for higher precision, a Wien filter having an eight-pole configuration, a 12-pole configuration, or any multipole configuration may be used.

FIG. 4a is a view where the Wien filter is viewed from a direction of the camera 32. It is assumed that an X-Y plane is a plane perpendicular to the imaging-system optical axis 11, and a direction of the electron gun (a direction from which the electron beam flies) in the X-Y plane is an X-axis positive direction. In order to bend the electron beam proceeding from the irradiating-system optical axis 10 to a normal direction of the surface of the specimen 30, a voltage with +E is applied to an electrode (61d) to the X-axis positive direction, and a voltage with −E is applied to an electrode (61b) in an X-axis negative direction. Meanwhile, in order to generate an identical deflection action, there is a method to apply a current to the coil 62 to apply a magnetic field B in a Y-axis negative direction. At this time, magnitudes of an electric potential E and the magnetic field B are determined by an angle θ desired to be bent and the accelerating voltage of the electron beam. In order to cause the inverted electron beam that has come from the specimen to travel in a straight line, it is necessary to, for example, apply an electric potential with +E to the electrode (61d) in the X-axis positive direction and apply the electric potential with +E to the electrode (61b) in the X-axis negative direction, and simultaneously, to apply the magnetic field B in the Y-axis negative direction to balance their magnitudes.

In order to simultaneously fulfill the condition to bend the electron beam emitted from the electron gun by the angle θ in the Wien filter and the condition to cause the electron beam inverted immediately above the specimen to travel in the straight line, it is necessary to perform an adjustment to find a combination of E and B where the electron beam that has come from the electron gun bends by the angle θ while examining a combination of B with E (or its opposite) having a magnitude such that the electron beam that has come from the specimen travels in the straight line.

Using the photoelectron by the ultraviolet rays ensures the adjustment taking only the electron beam that comes from the specimen as an object. Thus, after the straight-ahead condition is first obtained as a constraint function of B with respect to E, the condition to bend the electron beam by the angle θ can be searched taking only B as a parameter by introducing the electron beam from the electron gun. At this time, E as fulfilling the straight-ahead condition can be calculated from B using the constraint function.

FIG. 5 is a graph of E with respect to B when, after the specimen is irradiated with the ultraviolet rays to generate the photoelectron, the image of the photoelectron is focused on the scintillator, and then, the values of E and B are changed so as not to move this image. Using this graph as the constraint function ensures the adjustment to bend the electron beam that has come from the irradiating system by θ while keeping the straight-ahead condition.

Incidentally, before this adjustment of the beam separator, for example, the imaging lens can be adjusted. At this time, the photoelectron image is seen clearer compared with before the adjustment of the imaging system. Thus, the beam separator can be adjusted with higher precision. Comparing the photoelectron image with a mirror image generated by the electron beam from the electron gun can evaluate a position into which an aberration has ended up.

Second Embodiment

In this embodiment, a description will be given of an electron microscope including a first column (a charged-particle optical system or a mirror body) that surrounds an electron beam trajectory before entering an aberration corrector and a second column that surrounds an electron beam trajectory that has been emitted from the aberration corrector. In this embodiment, as exemplified in FIG. 6, a description will be given of a device including an ultraviolet-ray light source 50 to irradiate a mirror-type aberration corrector 110 with the ultraviolet rays. The mirror-type aberration corrector is a device to generate a negative aberration with respect to the electron optical system to cancel a positive aberration on the electron beam, thus reducing the aberration to increase the resolution.

Figure 6:
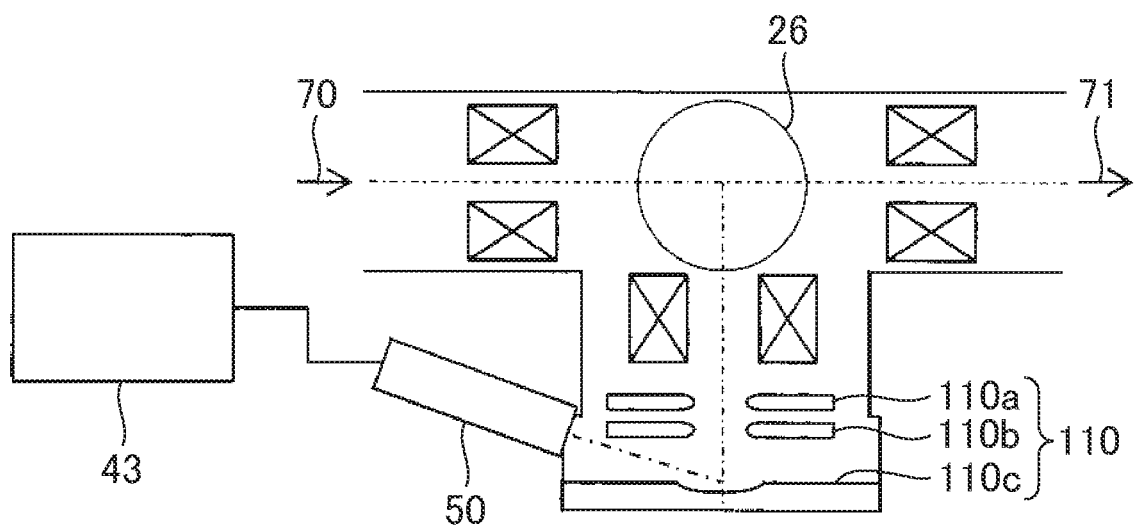
FIG. 6 is a view illustrating a configuration of a mirror aberration corrector.

In FIG. 6, the electron beam enters from a left direction (an entering electron beam 70) to pass through to a right direction (a passing electron beam 71). For example, a magnetic-field-sector-type deflector 26 can be used as the beam separator. In the optical system exemplified in FIG. 6, the mirror-type aberration corrector 110 is arranged on a deflection destination of the electron beam by the magnetic-field-sector-type deflector 26. A negative electric potential slightly higher than the accelerating voltage of the electron is applied to a lowest-part electrode 110c. The electron beam that has perpendicularly entered the mirror-type aberration corrector 110 is inverted before reaching the lower electrode 110c.

It is difficult to simultaneously adjust to bend the entering electron beam 70 in the magnetic-field-sector-type deflector 26 such that the entering electron beam 70 perpendicularly enters the mirror-type aberration corrector, and to cause the electron beam that has come by being inverted in the mirror-type aberration corrector 110 to proceed to the optical axis of the passing electron beam 71.

Therefore, the ultraviolet-ray light source 50 described in First Embodiment is disposed to irradiate the lower electrode 110c with the ultraviolet rays. A selective adjustment of the second column is ensured by leading the photoelectron generated by the mirror-type aberration corrector 110 to the optical axis of the passing electron beam 71 based on the ultraviolet irradiation. In FIG. 6, the ultraviolet rays are entered from a side direction of the ideal optical axis of the mirror-type aberration corrector 110. However, the irradiation may be performed from a direction immediately above the mirror-type aberration corrector 110 (along the optical axis) so as to expect a center of the mirror-type aberration corrector 110. At this time, it is preferable to restrict the ultraviolet irradiation region so that upper electrodes 110a, 110b of the electron mirror are not exposed to the ultraviolet rays.

An exemplary specific axis adjustment is as follows. First, the lower electrode 110c is irradiated with the ultraviolet rays. The magnetic field of the deflector is adjusted so that the photoelectron generated from the electrode comes on the optical axis of the passing electron beam 71. Next, the ultraviolet rays are stopped to introduce the entering electron beam 70, the magnetic field is introduced into the magnetic-field-sector-type deflector 26, and then, an adjustment is performed with, for example, an aligner (not illustrated) such that the entering electron beam 70 perpendicularly enters the mirror-type aberration corrector 110.

Third Embodiment

This embodiment describes a specimen when the imaging lens by the photoelectron and the beam separator are adjusted. When brightness of the electron beam is more needed in photoelectron imaging, it is preferable to use a metal having a low work function. For example, Ca, K, Nd, Na, Ba, and Li have work functions lower than 3 eV, thus ensuring an observation by the photoelectron even in a visible light having a long wavelength. That is, with respect to an ultraviolet lamp that emits lights having various wavelengths, a count of photons that generate a photoelectric effect increases, and a count of photoelectrons also increases. As a result, a contrast increases.

A specimen where the metal having the low work function is deposited on a material having a high work function in a certain constant pattern is also effective at the time of the adjustment. With this, irradiation with a light having a wavelength for causing only the metal having the low work function to generate the photoelectric effect emits the photoelectron from only the pattern for forming a pattern image, thus ensuring an adjustment with high precision using an image having a higher contrast.

The embodiments as described above ensure the optical axis adjustment with high precision and with ease in the electron microscope including the electron optical system having two or more axes.

LIST OF REFERENCE SIGNS 10 irradiating-system optical axis
11 imaging-system optical axis
20 electron gun
21 irradiation lens
22 imaging lens
23 objective lens
24 beam separator
30 specimen
31 stage
32 camera
33 scintillator
40 control device
41 electron-gun control device
42 image obtaining device
43 ultraviolet-ray-light-source control device
50 ultraviolet-ray light source

The invention claimed is:
1. A charged particle beam device comprising:
a first charged particle column for charged particles emitted from a charged particle source;
a deflector that deflects the charged particles from the first charged particle column toward an object;
a second charged particle column for the charged particles to pass through after being reflected back from the object;
a light source for irradiating a light toward the object; and
a control device that, to maintain a certain deflection state,
obtains a plurality of deflection signals based on a detection of charged particles generated from the irradiation of the light emitted from the light source, and
selects or calculates a deflection signal from the plurality of deflection signals, or from relationship information created from the plurality of deflection signals, in which a predetermined condition is fulfilled.

2. The charged particle beam device according to claim 1, wherein the deflector deflects the charged particles that pass through inside the first charged particle column toward the object, and deflects the charged particles to lead the charged particles reflected on the object toward an optical axis of the second charged particle column.

3. The charged particle beam device according to claim 1, wherein the deflector is a Wien filter.

4. The charged particle beam device according to claim 3, wherein the control device obtains a plurality of combinations of electric fields and magnetic fields of the Wien filter that fulfill the predetermined condition to maintain the certain deflection state.

5. The charged particle beam device according to claim 4, comprising an image pickup device arranged inside the second charged particle column,
wherein the control device obtains the plurality of combinations of the electric fields and the magnetic fields such that the charged particles passing through the second charged particle column reach a predetermined position at the image pickup device, or such that the charged particles passing through the second charged particle column reach a position identical to a pattern position projected on the image pickup device when the deflection by the deflector is not performed.

6. The charged particle beam device according to claim 1, comprising an image pickup device arranged inside the second charged particle column,
wherein the control device obtains the plurality of deflection signals such that the charged particles passing through the second charged particle column reach a predetermined position at the image pickup device, or such that the charged particles reach a position identical to a pattern position projected on the image pickup device when the deflection by the deflector is not performed.

7. The charged particle beam device according to claim 6, wherein the control device selects or calculates the deflection signal where a reaching position of the charged particles passing through the second charged particle column that reach the image pickup device becomes the predetermined position, based on the irradiation of the charged particles emitted from the charged particle source.

8. The charged particle beam device according to claim 1, wherein the light source is an ultraviolet light source.

9. A method for adjusting a charged particle beam device including a first charged particle column for charged particles emitted from a charged particle source, a deflector that deflects the charged particles from the first charged particle column toward an object, and a second charged particle column for the charged particles to pass through after being reflected back from the object, the adjustment method comprising:

irradiating a light toward the object;

obtaining a plurality of deflection signals to maintain a certain deflection state based on a detection of charged particles detected based on the irradiation of the light; and selecting or calculating a deflection signal from the plurality of deflection signals, or from relationship information created from the plurality of deflection signals, in which a predetermined condition is fulfilled.

* * * * *